(12) United States Patent
Zhang et al.

(10) Patent No.: US 12,710,702 B2
(45) Date of Patent: Aug. 18, 2026

(54) APPARATUSES AND METHODS FOR REDUCING PARTICLE CONTAMINATION OF WAFERS DURING TRANSFER

(71) Applicant: Taiwan Semiconductor Manufacturing Company, LTD., Hsinchu (TW)

(72) Inventors: Zheng-Hao Zhang, Hsinchu (TW); Hsin Yi Tseng, New Taipei (TW); Chueh-Chi Kuo, Kaohsiung (TW); Li-Jui Chen, Hsinchu (TW); Heng-Hsin Liu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 236 days.

(21) Appl. No.: 18/512,612

(22) Filed: Nov. 17, 2023

(65) Prior Publication Data

US 2025/0164899 A1 May 22, 2025

(51) Int. Cl.
*G03F 7/00* (2006.01)
*H10P 72/30* (2026.01)

(52) U.S. Cl.
CPC .......... *G03F 7/70866* (2013.01); *H10P 72/30* (2026.01)

(58) Field of Classification Search
CPC ......... H01L 21/67201; H01L 21/67126; H01L 21/67742; H01L 21/67196; H01L 21/67748; H01L 21/67184; H10P 72/0466; H10P 72/0441; H10P 72/3302; H10P 72/0464; H10P 72/3306; H10P 72/0461
See application file for complete search history.

(56) References Cited

U.S. PATENT DOCUMENTS 5,364,219 A * 11/1994 Takahashi ......... H01L 21/67724 414/217
2008/0247846 A1* 10/2008 Mochizuki ........ H01L 21/67248 414/221
2009/0098297 A1* 4/2009 Sakai ............... H01L 21/67748 118/69
2013/0052599 A1* 2/2013 Toyozawa ........... F27B 17/0025 432/77
2014/0295672 A1* 10/2014 Tauchi ............. H01L 21/67184 156/345.31
2015/0227050 A1* 8/2015 Lin .................. H01L 21/67115 438/5
2021/0005477 A1* 1/2021 Son ....................... C23C 16/481
2021/0280441 A1* 9/2021 Amikura ........... H01L 21/67167

* cited by examiner

*Primary Examiner* — Glenn F Myers
(74) *Attorney, Agent, or Firm* — Lippes Mathias LLP

(57) ABSTRACT

A load-lock chamber with reduced particle contamination is disclosed. At least one movable particle shield is placed between the gate valve and a wafer location. Particles which can be generated due to contact between the gate valve door and its seat are blocked or inhibited by the particle shield from landing in the wafer location, reducing particle contamination. Methods for operating the load-lock chamber are also disclosed.

20 Claims, 16 Drawing Sheets

FIG. 2B
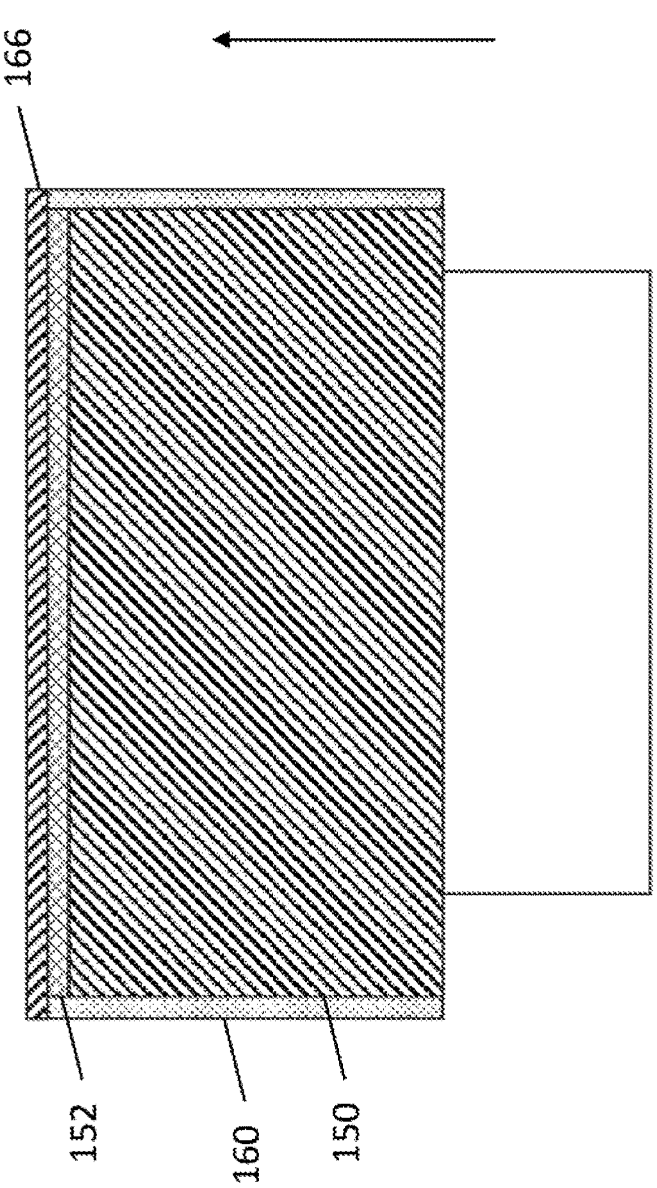
166
152
160
150
140

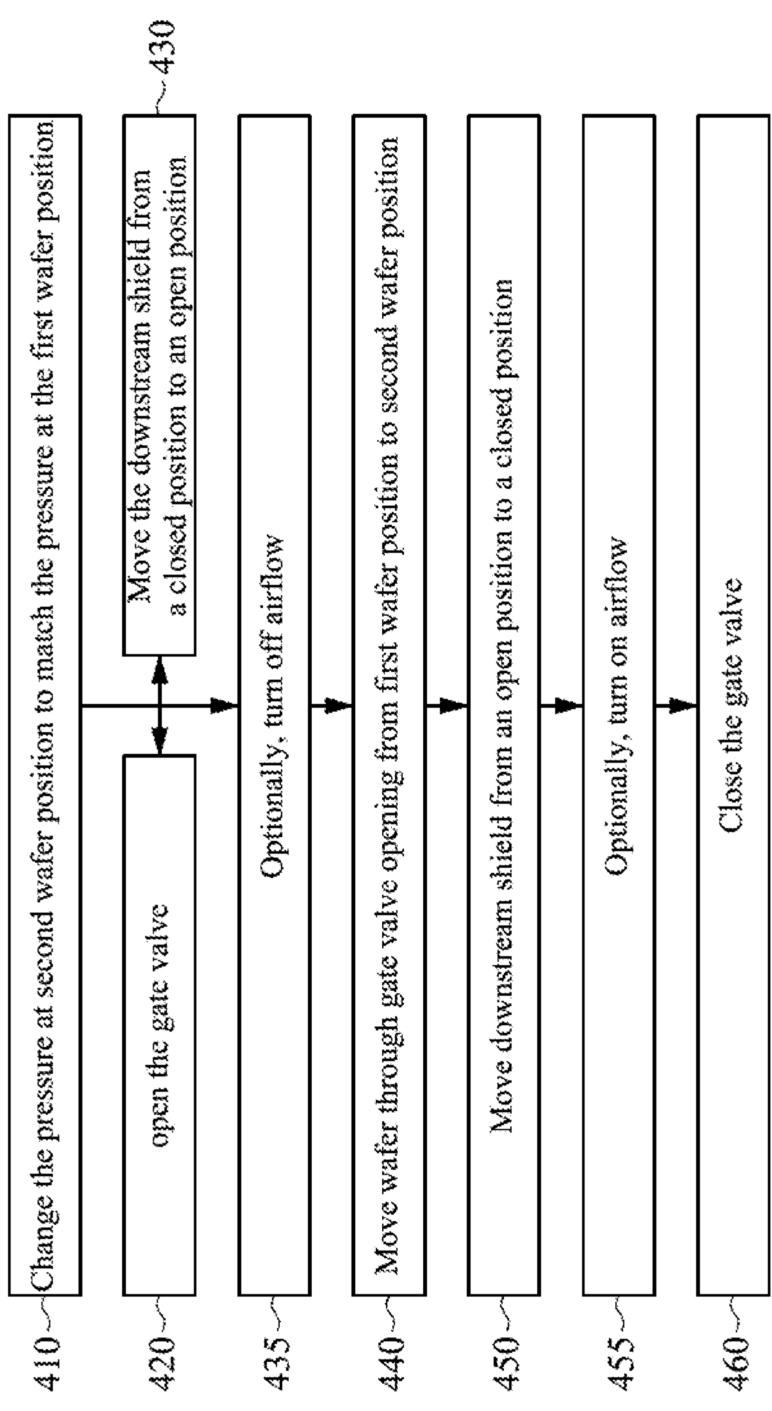
Fig. 4

Figure 12:
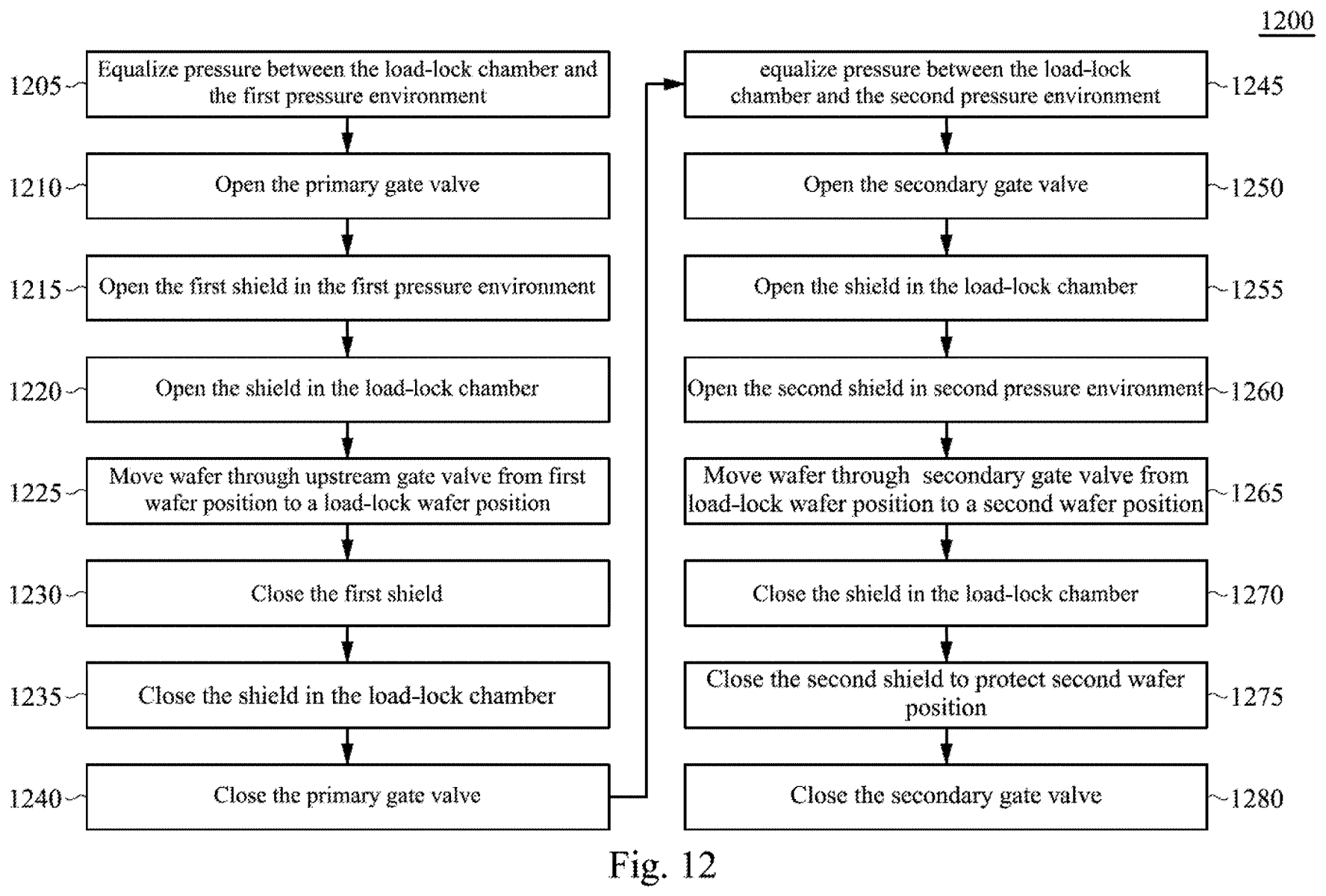

1200

1205 Equalize pressure between the load-lock chamber and the first pressure environment 1210 Open the primary gate valve 1215 Open the first shield in the first pressure environment 1220 Open the shield in the load-lock chamber 1225 Move wafer through upstream gate valve from first wafer position to a load-lock wafer position 1230 Close the first shield 1235 Close the shield in the load-lock chamber 1240 Close the primary gate valve 1245 equalize pressure between the load-lock chamber and the second pressure environment 1250 Open the secondary gate valve 1255 Open the shield in the load-lock chamber 1260 Open the second shield in second pressure environment 1265 Move wafer through secondary gate valve from load-lock wafer position to a second wafer position 1270 Close the shield in the load-lock chamber 1275 Close the second shield to protect second wafer position 1280 Close the secondary gate valve

APPARATUSES AND METHODS FOR REDUCING PARTICLE CONTAMINATION OF WAFERS DURING TRANSFER

BACKGROUND

Integrated circuits are formed on a semiconductor wafer. Some photolithographic patterning processes use extreme ultraviolet light (EUV) to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a front view showing a gate valve in a closed position.

FIG. 4 is a flow chart showing a method for reducing or preventing particle contamination in a wafer transfer chamber, in accordance with some embodiments.

FIG. 12 is a flow chart illustrating another method for transferring a wafer between a first pressure environment and a second pressure environment through a load-lock chamber.

FIG. 14 is a flow chart illustrating another method for transferring a wafer between a first pressure environment and a second pressure environment through a load-lock chamber.

DETAILED DESCRIPTION

Figure 1:
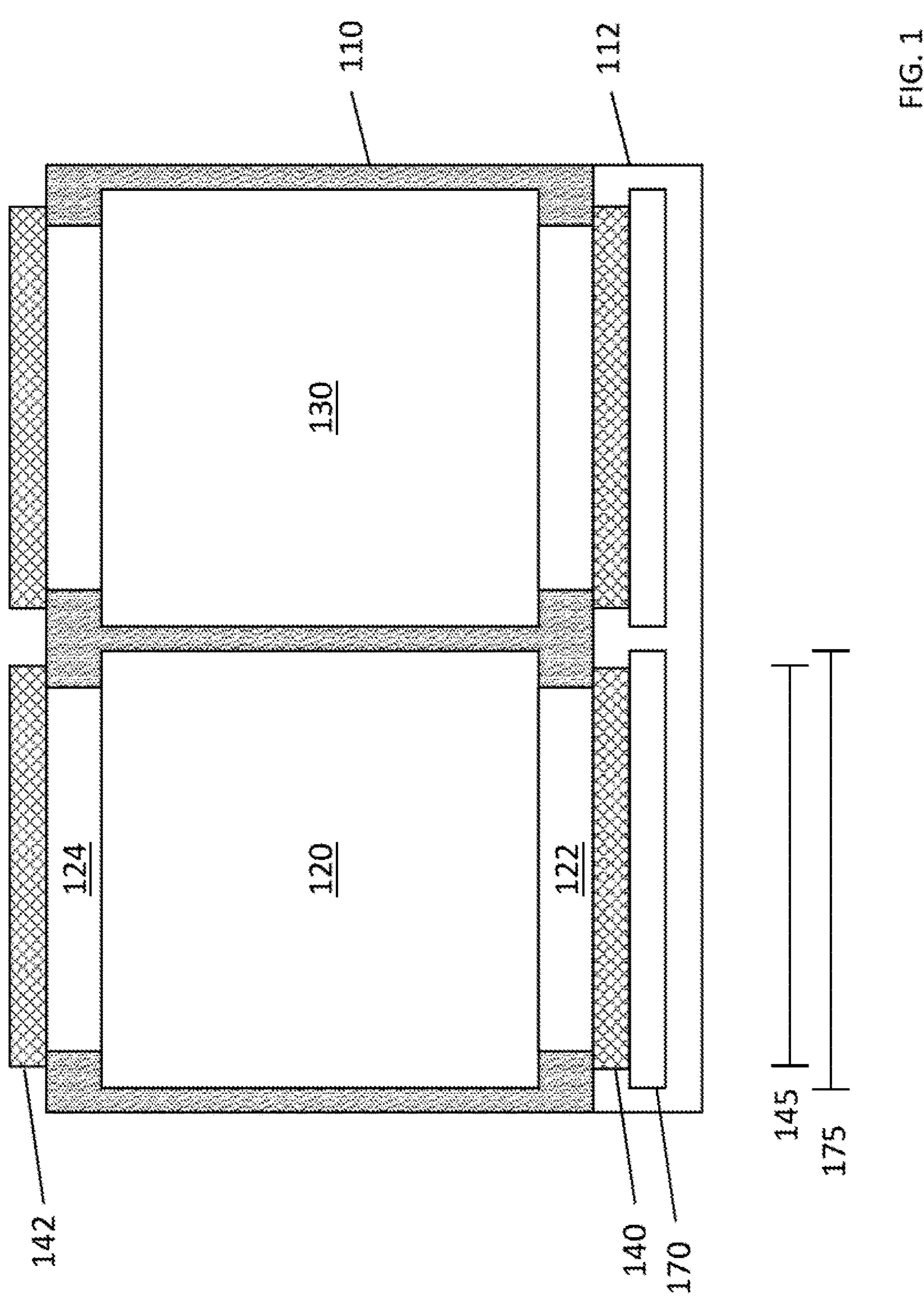
FIG. 1 is a schematic view of a load-lock apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure relates to apparatuses and methods in which a wafer substrate is passed through a load-lock chamber that separates two environments having different pressures, such as may occur with an EUV tool used for EUV photolithography. The terms “input” and “output” may be used relative to the direction in which the wafer substrate passes through the load-lock chamber, e.g. the wafer substrate enters the chamber through the input, and exits the chamber through the output. The terms “upstream” and “downstream” are also relative to the direction in which the wafer substrate passes through various components, i.e. the substrate travels past or through an upstream component before traveling past or through the downstream component. It is noted that the same structure may be considered an input/upstream component and also an output/downstream component, depending on the direction in which the wafer substrate is traveling.

The present disclosure may refer to "high" pressure and "low" pressure. These terms are relative to each other, and should not be construed as requiring a pressure to be above or below a threshold value.

The EUV photolithography process employs light in the extreme ultraviolet (EUV) region, having a wavelength of about 1 nm to about 100 nm. One type of EUV light source is laser-produced plasma (LPP), which produces EUV light by focusing a high-power laser beam onto small target droplets to form highly ionized plasma that emits EUV radiation with a peak maximum emission at about 13.5 nm. The EUV light is then collected by a collector mirror and reflected by optics towards a photolithographic mask and then towards a lithography target, e.g., a wafer substrate. However, EUV light is easily absorbed by any material, including gases. Thus, EUV photolithography is typically performed in vacuum. Other semiconductor manufacturing processes, such as chemical vapor deposition (CVD) or dry etching, are also typically performed at very low pressures or vacuum.

The transfer of wafer substrates between a high pressure environment (e.g. atmospheric pressure) and a low pressure environment is usually performed via a load-lock chamber that is capable of switching an internal pressure between a high pressure state and a low pressure state. The load-lock chamber is pressurizable, and uses two gate valves (also known as slit valves) to transfer the wafer substrate and control the internal pressure. However, this hardware can produce particles during closing due to contact between the gate valve seal and the gate valve seat. More particles may be released over time, due to wear and erosion of the seal and the seat. Thus, the seal and seat must be maintained or replaced to avoid wafer fall-on issues which can reduce wafer yield. In addition, hardware maintenance action is usually taken to maintain high wafer quality by preemptive replacement of the load-locks and their seals. This preventative maintenance can take as much as 24 hours per month, or about 3.3% of available time per month (AVL). It is also difficult to remove particles from the wafer substrate in a vacuum environment.

The present disclosure thus relates to apparatuses and methods for protecting wafer substrates from particle contamination due to wear of the gate valve (particularly the seal or the seat). One or more protective shields are used to protect wafer substrates from any particles which are generated at the gate valve. The addition of such shields can reduce particle contamination, increase wafer yield, improve the AVL, and reduce downtime, among other benefits.

FIG. 1 is a schematic view of a load-lock apparatus 100, in accordance with some embodiments of the present disclosure, and with some dimensions exaggerated for ease of understanding. The load-lock apparatus 100 is formed from a body 110 that is shaped to form one or more load-lock chambers within the body. As illustrated here, the body 110 includes two load-lock chambers 120, 130, although any number of load-lock chambers can be present in the body. The following discussion is provided in terms of chamber 120, and it should be understood to apply to each chamber as well.

Each chamber of the load-lock apparatus includes a first slot 122 and a second slot 124, which are located on opposite walls or sides of the chamber. Each chamber also includes a first gate valve 140 and a second gate valve 142, which are also located on opposite walls and are used to control passage through their respective slot. Depending on the direction in which the wafer substrate travels, each gate valve may also be referred to as an input gate valve, an upstream gate valve, an output gate valve, or a downstream gate valve.

Each gate valve 140 of the load-lock chamber can be open or closed. When open, the respective slot 122, 124 is exposed so that a wafer substrate can be moved in or out of the interior of the load-lock chamber. When the gate valve is closed, the load-lock chamber is gas-tight, so that the interior can be pressurized as desired. A vacuum pump and appropriate control valve can be used to change the pressure within the load-lock chamber, either by pumping down to vacuum or by venting to atmospheric pressure. The load-lock chamber may also be temperature controlled.

The load-lock chamber 120 may include one or more immobile substrate supports (not shown) adapted to permit a wafer substrate (not shown) to be placed and supported thereon by an automated material handling system (AMHS), which for example is usually in the form of a robotic arm. One wafer passes through the load-lock chamber at a time. The wafer substrate can be accessed by extending the robotic arm through a slot 122, 124 as desired. The substrate support can be made of any suitable structure, such as pins, pedestals, slots, platforms, or the like. The substrate support may contact the center of the wafer substrate or the edges of the wafer substrate, as desired.

In the present disclosure, one or more shields are also incorporated into each load-lock chamber. The shield may generally have any shape, such as circular or rectangular or linear, and is configured to block particle contact with the wafer substrate.

As illustrated here in FIG. 1, a shield 170 is illustrated as being located in front of the first gate valve 140. Put another way, the shield 170 is located outside the load-lock chamber 120 adjacent the first gate valve 140, or the first gate valve 140 is located between the shield 170 and the load-lock chamber 120. As illustrated here, the shield is in the form of a rectangular wall. The shield also has a width 175 which is greater than the width 145 of the gate valve 140. The first gate valve 140 and the shield 170 both pass through a ledge 112 which is part of the body 110.

Figure 2A:
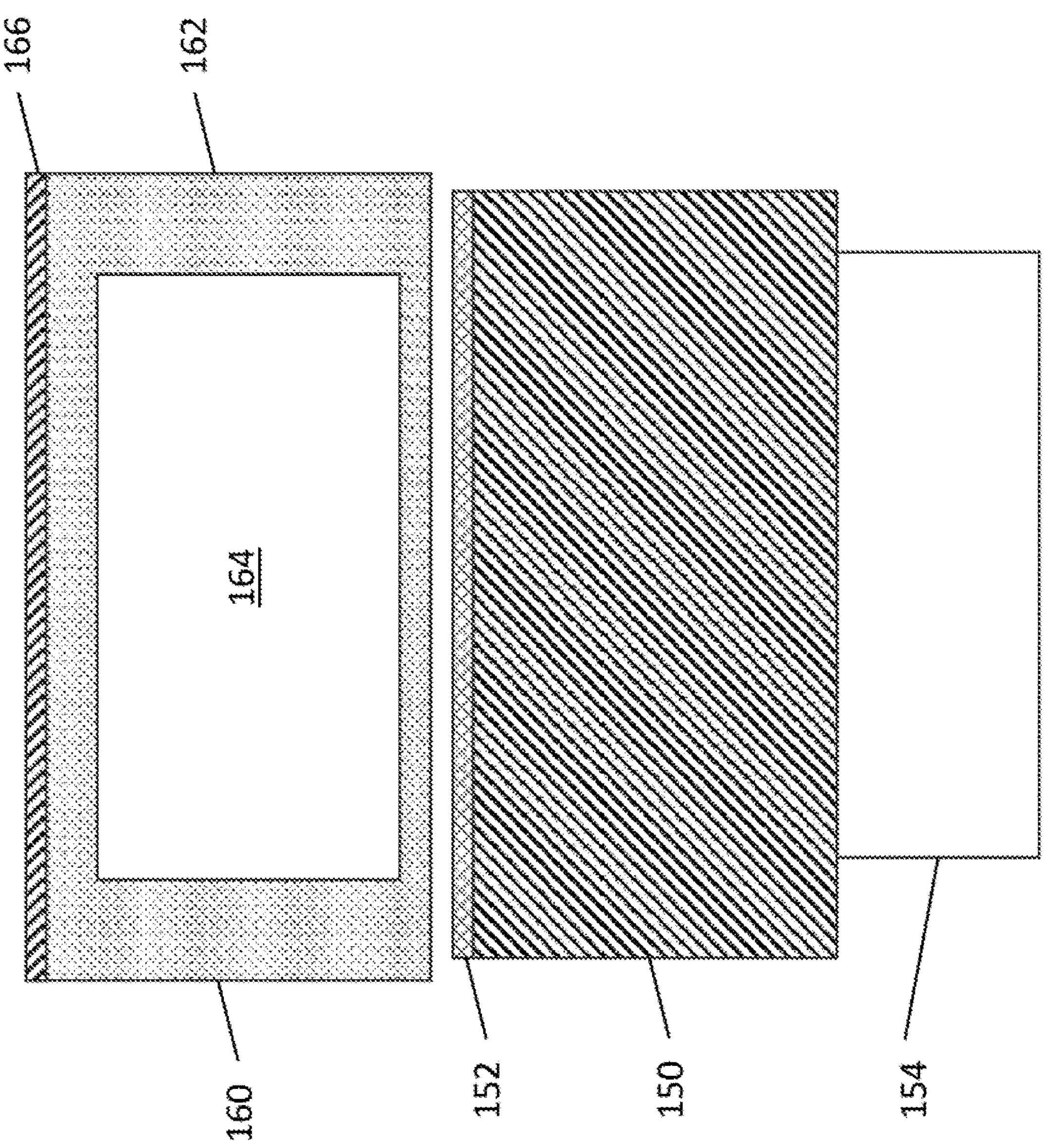
FIG. 2A is a front view showing a gate valve in an open position.

Continuing, FIG. 2A shows the gate valve in an open position, and FIG. 2B shows the gate valve in a closed position. Starting with FIG. 2A, the gate valve 140 may be considered as including a door 150 and a seat 160. A seal 152 is present on the top edge of the door 150. The seal may be made of a flexible or elastic material, such as rubber or perfluoroelastomers such as those known by the trade name ZALAK. Such perfluoroelastomers contain fluorine, carbon, silicon, and oxygen. As illustrated here, the top edge of the door includes a central section which includes a horizontal surface and two side sections on each side of the central section which are inclined with respect to the central section. The seal 152 conforms to the top edge of the door. The door 150 is mounted upon a feedthrough 154, and can be opened or closed using pneumatic means or other powered methods.

The seat 160 is formed from a plate 162 with an opening 164 passing through the plate, and a flange 166 which will engage the seal 152 of the door. The flange 166 may include one or more blocks that engage the seal 152. The seat may be made from metal such as AISI 316L stainless steel, which contains nickel, chromium, molybdenum, manganese, silicon, carbon, and iron. The block(s) may be made, for example, from polyetheretherketone (PEEK) or other suitable material. The block materials may contain carbon, oxygen, and sulfur.

Referring now to FIG. 2B, in the closed position, the door 150 is moved up to press the seal 152 against the flange 166 of the seat. This seals the opening (not visible) of the gate valve and the respective slot in the body of the load-lock chamber, such that gas cannot pass through. Thus, the interior volume of the load-lock chamber is separated from the exterior of the load-lock chamber.

Depending on the materials used for the seat and seal, the particles generated due to wear may include silicon, carbon, oxygen, fluorine, and aluminum, etc.

Figure 3:
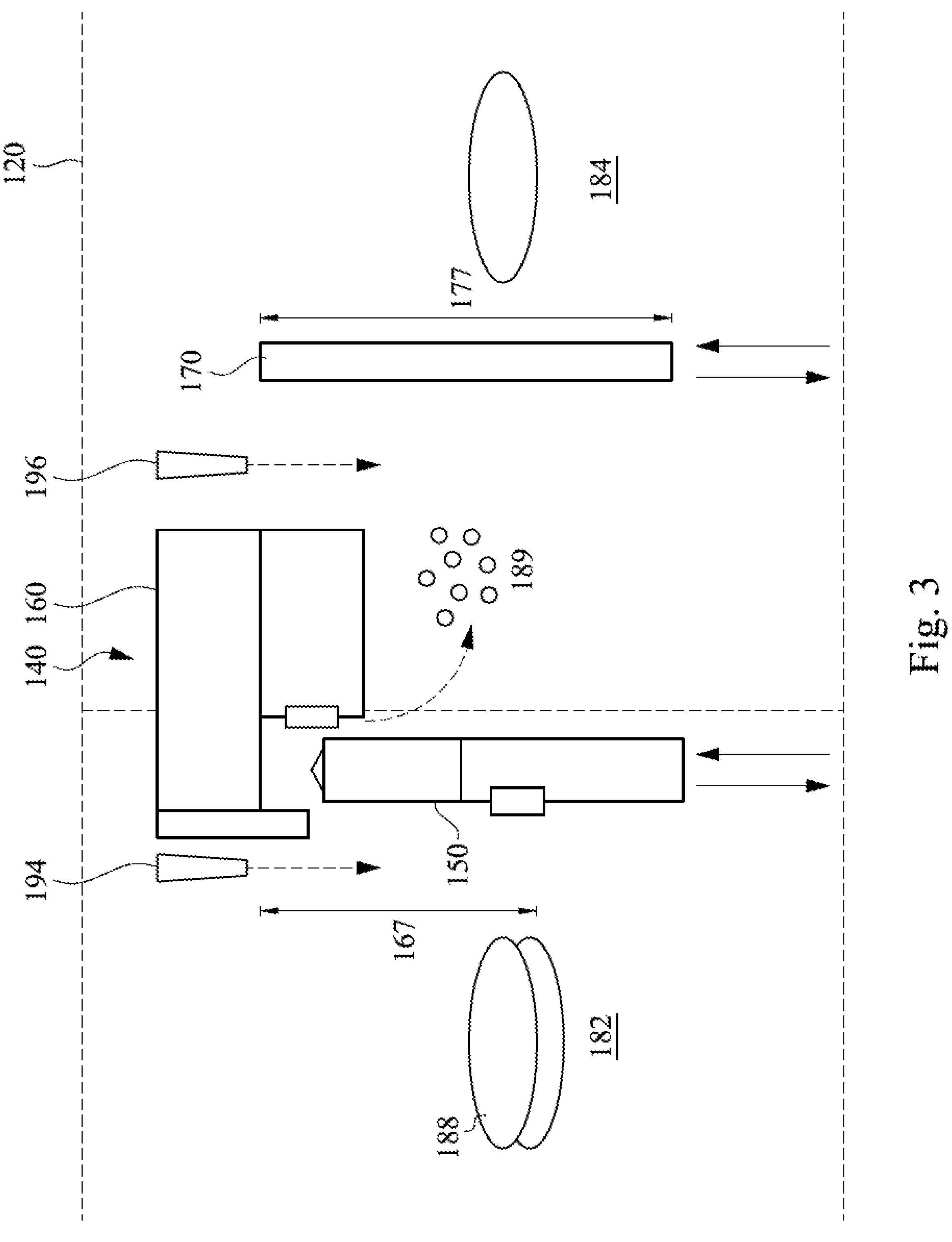
FIG. 3 is a general side view schematic of a load-lock chamber that includes a mobile shield, according to various embodiments of the present disclosure.

FIG. 3 is a side view schematic of a load-lock chamber 120 that includes a shield 170, according to various embodiments of the present disclosure. Generally, as illustrated here, there is a gate valve 140 which includes a door 150 and a seal 160. The gate valve 140 is located between a first wafer position 182 and a second wafer position 184. Here, the first wafer position 182 is outside of the load-lock chamber 120 (illustrated with dashed line), and the second wafer position 184 is within the load-lock chamber (which can also be called a load-lock wafer position). A wafer substrate 188 is illustrated as being located at the first wafer position 182.

When the door 150 of the gate valve contacts the seal 160 during closing, particles 189 may be generated. The movable shield 170 is located between the gate valve 140 and the second wafer position 184, and reduces or prevents the particles from landing on a wafer substrate present in the second wafer position. The shield is also used to reduce or prevent particles from landing on the second wafer position when no wafer substrate is present. This prevents the particles from being subsequently picked up when a wafer substrate is moved to the second wafer position and potentially being carried elsewhere within the system.

As noted here, the opening of the gate valve seat 160 is located above the second wafer position 184, and this vertical distance is indicated with reference numeral 167. In embodiments, the height 177 of the shield 170 is at least equal to this vertical distance. In other embodiments, the height of the shield may be up to 5 centimeters (cm) greater than the vertical distance between the opening of the gate valve seat and the second wafer position.

In FIG. 3, the gate valve door 150 and the shield 170 are both illustrated as rising upwards to the closed position, and lowering downwards to the open position. However, this is not required, and they may operate from different orientations from each other. For example, the shield 170 could be lowered from above the load-lock chamber downwards to the closed position, or could move from one side to the closed position.

FIG. 4 is a flow chart illustrating some methods 400 of the present disclosure, in accordance with some embodiments. These methods aid in reducing or preventing particle contamination in a wafer transfer chamber, such as a lock-load chamber. The various steps of the method are also described with reference to FIG. 3.

Initially, it is assumed that the gate valve 140 and the shield 170 are both in a closed position, such that the first wafer position 182 and the second wafer position 184 are separated from each other. The first wafer position is in a first pressure environment 190, and the second wafer position is in a second pressure environment 192. Referring now to FIG. 4, if the first wafer position 182 and the second wafer position 184 are not at the same pressure, then in step 410 the pressure at the second wafer position is changed to match the pressure at the first wafer position. Put another way, the second pressure environment is equalized with the first pressure environment.

Next, in step 420, the gate valve is opened. In other words, the gate valve is moved from a closed position to an open position. Continuing, the shield 170 can be labeled a downstream shield because it is downstream of the gate valve 140 when a wafer substrate is being moved from the first wafer position to the second wafer position. In step 430, the downstream shield 170 is moved from a closed position to an open position. It is noted that steps 420 and 430 can be performed in any order, because the opening of the gate valve does not generate particles. However, generally, the gate valve is opened before the downstream shield 170 is opened. Next, in step 440, the wafer is moved from the first wafer position 182 through the opening of the gate valve to the second wafer position 184. This can be done, for example, using a robotic arm which supports the wafer substrate.

Next, in step 450, the downstream shield 170 is moved from an open position to a closed position. Then, in step 460, the gate valve is closed. Particles may be generated when the gate valve is closed, due to contact between the door seal and the seat. The use of the downstream shield 170 thus protects the wafer from any particles that may be generated by closing the gate valve 140.

It is noted that the opening and closing of the shield 170 does not generate any particles because the shield 170 does not make contact with any object such as a seat or a lid. The function of the shield 170 is to protect the wafer from particles, and the shield does not need to make the chamber gas-tight, whereas the gate valve does serve a gas-sealing function and so must make contact with the gate valve seat.

In some embodiments, the load-lock chamber 120 may also be configured to provide a downwards airflow, so that any particles are carried by such airflow and do not fall on the wafer substrate either at the first wafer location or the second wafer location. This is illustrated in FIG. 3 with nozzles 194, 196. With nozzle 194, a downwards airflow is provided between the first wafer position 182 and the gate valve 140. With nozzle 196, a downwards airflow is provided between the second wafer position 184 and the gate valve 140. Here, the downwards airflow is also located between the gate valve 140 and the shield 170. Such airflow may be configured to only be activated when the wafer is not being moved and/or when the gate valve is being closed and afterwards. The use of airflow is shown in FIG. 4 with respect to nozzle 194 located between the first wafer position and the gate valve. In optional step 435, airflow is turned off before step 440 where the wafer is moved to the second wafer position. In optional step 455, airflow is turned on before step 460 where the gate valve is closed. However, such airflow cannot occur in a vacuum environment.

Figure 5:
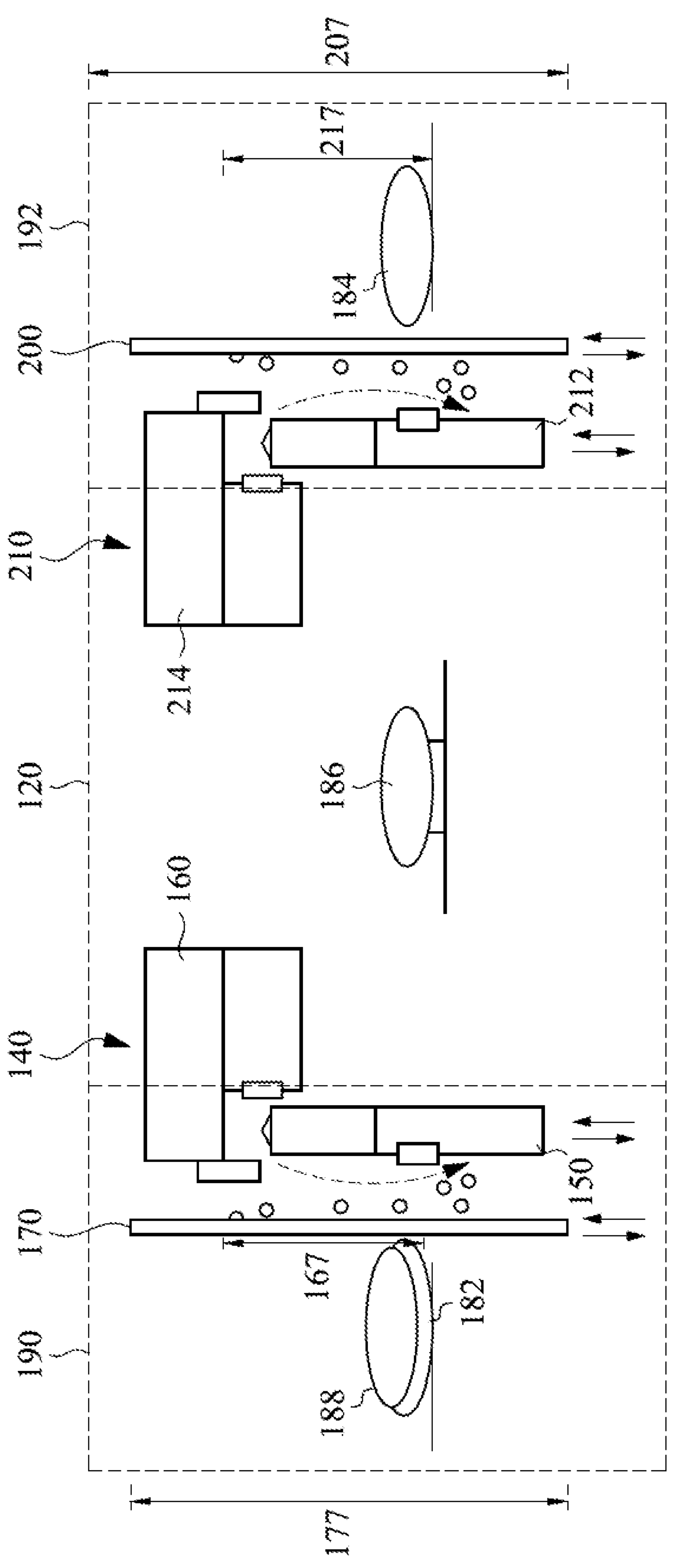
FIG. 5 is a side view schematic of another embodiment of a load-lock apparatus, having two movable shields outside of the load-lock chamber.

FIG. 5 is a side view schematic of another embodiment of a load-lock apparatus. Here, two shields 170, 200 are present outside of the load-lock chamber 120. A first wafer position 182 is shown on the left-hand side, and a second wafer position 184 is shown on the right-hand side. A load-lock wafer position 186 is indicated within the load-lock chamber. A first or primary or upstream gate valve 140 is shown with a door 150 and a seat 160. A second or secondary or downstream gate valve 210 is shown on the opposite side of the load-lock chamber 120, which also has a door 212 and a seat 214. The first wafer position is located in a first pressure environment 190 (indicated with dashed line), and the second wafer position is located in a second pressure environment 192 (indicated with dashed line).

A first or upstream shield 170 is present in the first pressure environment 190 adjacent the first gate valve 140. The first shield can also be described as being located outside or upstream of the first gate valve. A second or downstream shield 200 is present in the second pressure environment 192 adjacent the second gate valve 210. The second shield can also be described as being located outside or downstream of the second gate valve 210. As illustrated here, the first shield 170 will reduce or prevent particles from landing at the first wafer position 182. Similarly, the second shield 200 will reduce or prevent particles from landing at the second wafer position 184. As illustrated here, both shields 170, 200 are in the form of a rectangular wall.

In particular embodiments, the height 177 of the first shield 170 is at least equal to the vertical distance 167 between the opening of the upstream gate valve seat 160 and the first wafer position 182. Similarly, the height 207 of the second shield 200 is at least equal to the vertical distance 217 between the opening of the downstream gate valve seat 214 and the second wafer position 184. It is noted that the vertical distances of the two gate valves is typically the same. Similarly, when multiple shields are present, their heights are typically the same.

Figure 6:
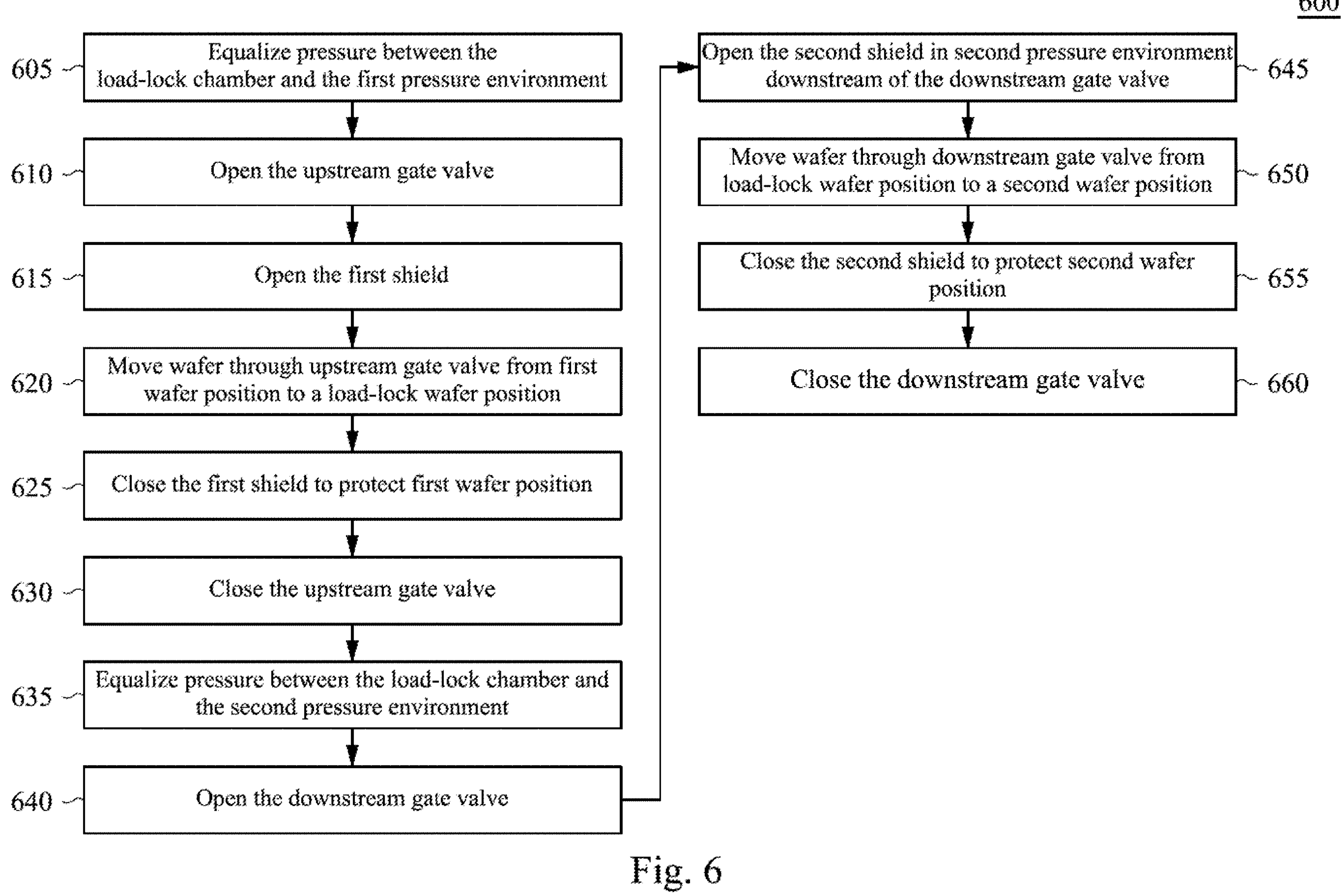
FIG. 6 is a flow chart illustrating a method for transferring a wafer between a first pressure environment and a second pressure environment through a load-lock chamber.

FIG. 6 is a flow chart illustrating a method 600 for transferring a wafer between a first pressure environment and a second pressure environment through a load-lock chamber. The various steps of the method are described with reference to FIG. 5.

Initially, it is assumed that the upstream gate valve 140, the first shield 170, the downstream gate valve 210, and the second shield 200 are all in the closed position. If the first pressure environment 190 and the load-lock chamber 120 are not at the same pressure, then in step 605 the load-lock chamber pressure is equalized with the first pressure environment. As a result, the pressures are equal within the first pressure environment and the load-lock chamber.

Next, in step 610, the upstream gate valve 170 leading from the first pressure environment to the load-lock chamber is opened. Next, in step 615, the first shield 170 is opened. Again, steps 610 and 615 can be performed in any order because opening the gate valve does not generate particles. Next, in step 620, the wafer substrate 188 is transferred from the first wafer position 182 through the upstream gate valve to the load-lock wafer position 186 in the load-lock chamber. Next, in step 625, the first shield 170 is closed. Then, in step 630, the upstream gate valve 140 is closed. As a result, the load-lock chamber is gas-tight.

Continuing, in step 635 the load-lock chamber pressure is equalized with the second pressure environment 192. Then, in step 640, the downstream gate valve 210 leading from the load-lock chamber to the second pressure environment is opened. Next, in step 645, the second shield 200 is opened. Again, steps 640 and 645 can be performed in any order because opening the gate valve does not generate particles. Next, in step 650, the wafer substrate 188 is transferred from the load-lock wafer position 186 in the load-lock chamber through the downstream gate valve to the second wafer position 184. Next, in step 655, the second shield 200 is closed. Then, in step 660, the downstream gate valve 210 is closed.

Figure 7:
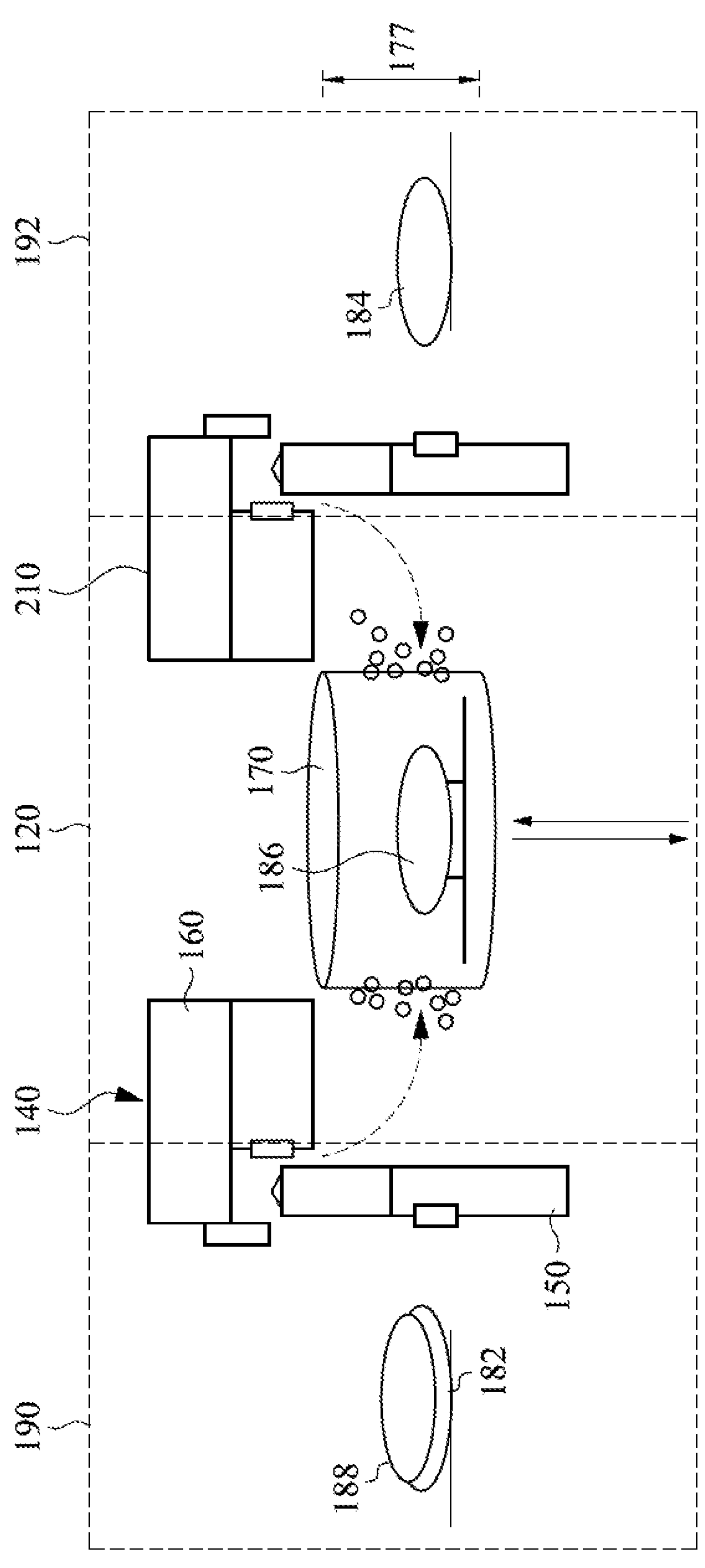
FIG. 7 is a side view schematic of a third embodiment of a load-lock apparatus. A single movable shield is present within the load-lock chamber.

FIG. 7 is a side view schematic of a third embodiment of a load-lock apparatus. Here, a single shield 170 is located within the load-lock chamber 120. The shield is in the form of a wall which surrounds the load-lock wafer position 186. However, the shield does not cover the top of the load-lock wafer position. This wall may have, for example, a circular shape. This shield can also be raised or lowered between a closed position and an open position. The height 177 of this shield 170 is at least equal to the vertical distance 167 between the opening of the gate valve seat 160 and the load-lock wafer position 186. It is noted that the two gate valves 140, 210 are typically located at the same height.

Figure 8:
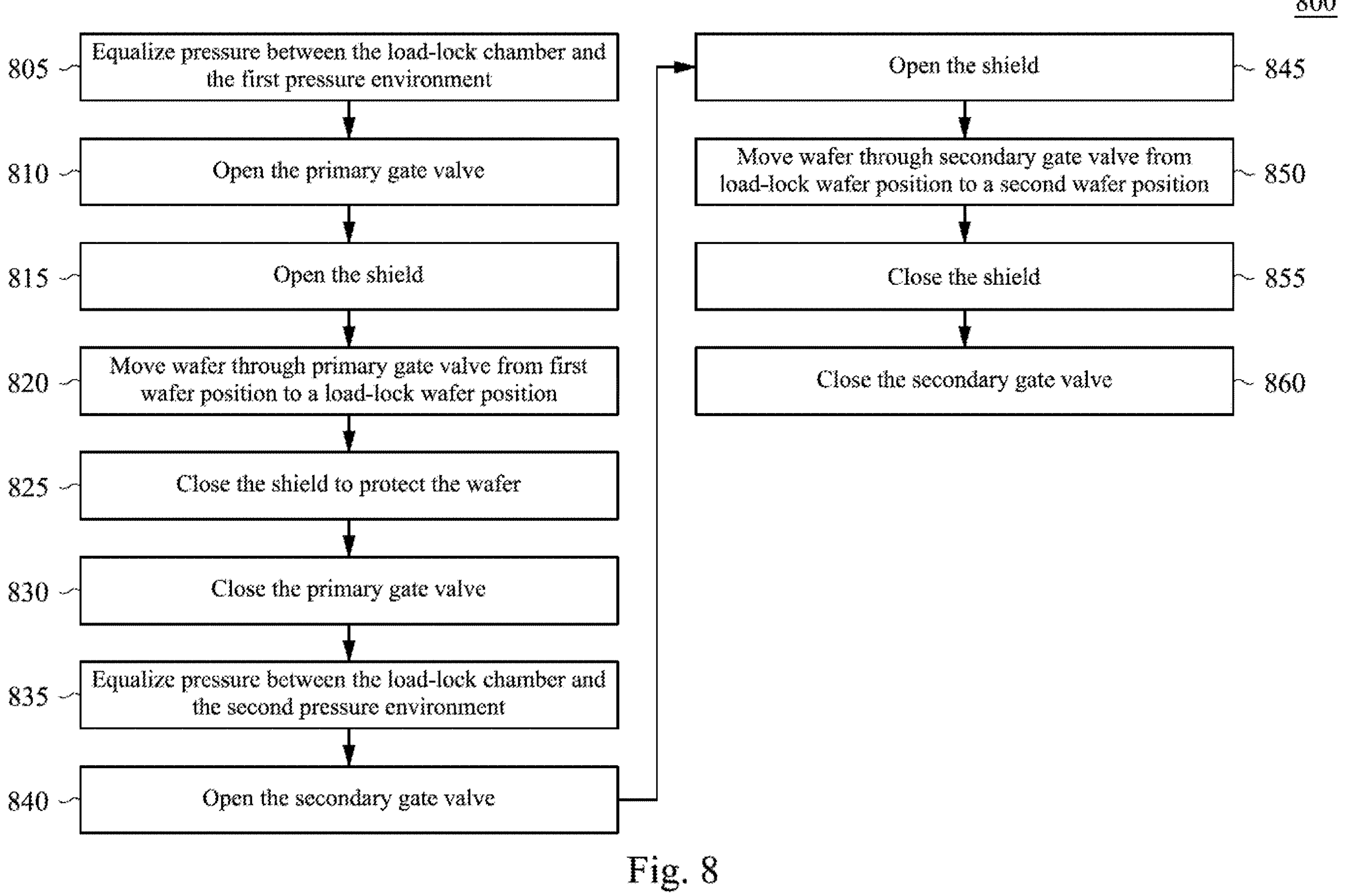
FIG. 8 is a flow chart illustrating another method for transferring a wafer between a first pressure environment and a second pressure environment through a load-lock chamber.

FIG. 8 is a flow chart illustrating another method 800 for transferring a wafer between a first pressure environment and a second pressure environment through a load-lock chamber. The various steps of the method are described with reference to FIG. 7.

Initially, it is assumed that the primary gate valve 140, the shield 170 within the load-lock chamber, and the secondary gate valve 210 are all in the closed position. In step 805, the load-lock chamber pressure can be equalized with the first pressure environment.

Next, in step 810, the primary gate valve 140 is opened. In step 815, the shield 170 in the load-lock chamber is opened. Again, steps 810 and 815 can be performed in any order because opening the gate valve does not generate particles. Next, in step 820, the wafer substrate 188 is transferred from the first wafer position 182 through the primary gate valve to the load-lock wafer position 186 in the load-lock chamber. In step 825, the shield 170 is closed. Then, in step 830, the primary gate valve 140 is closed. As a result, the load-lock chamber is gas-tight.

Continuing, in step 835 the load-lock chamber pressure is equalized with the second pressure environment 192. Then, in step 840, the secondary gate valve 210 is opened. In step 845, the shield 170 is opened. Again, steps 840 and 845 can be performed in any order because opening the gate valve does not generate particles. Next, in step 850, the wafer substrate 188 is transferred from the load-lock wafer position 186 in the load-lock chamber through the secondary gate valve to the second wafer position 184. Next, in step 855, the shield 170 is closed. Then, in step 860, the secondary gate valve 210 is closed.

Figure 9:
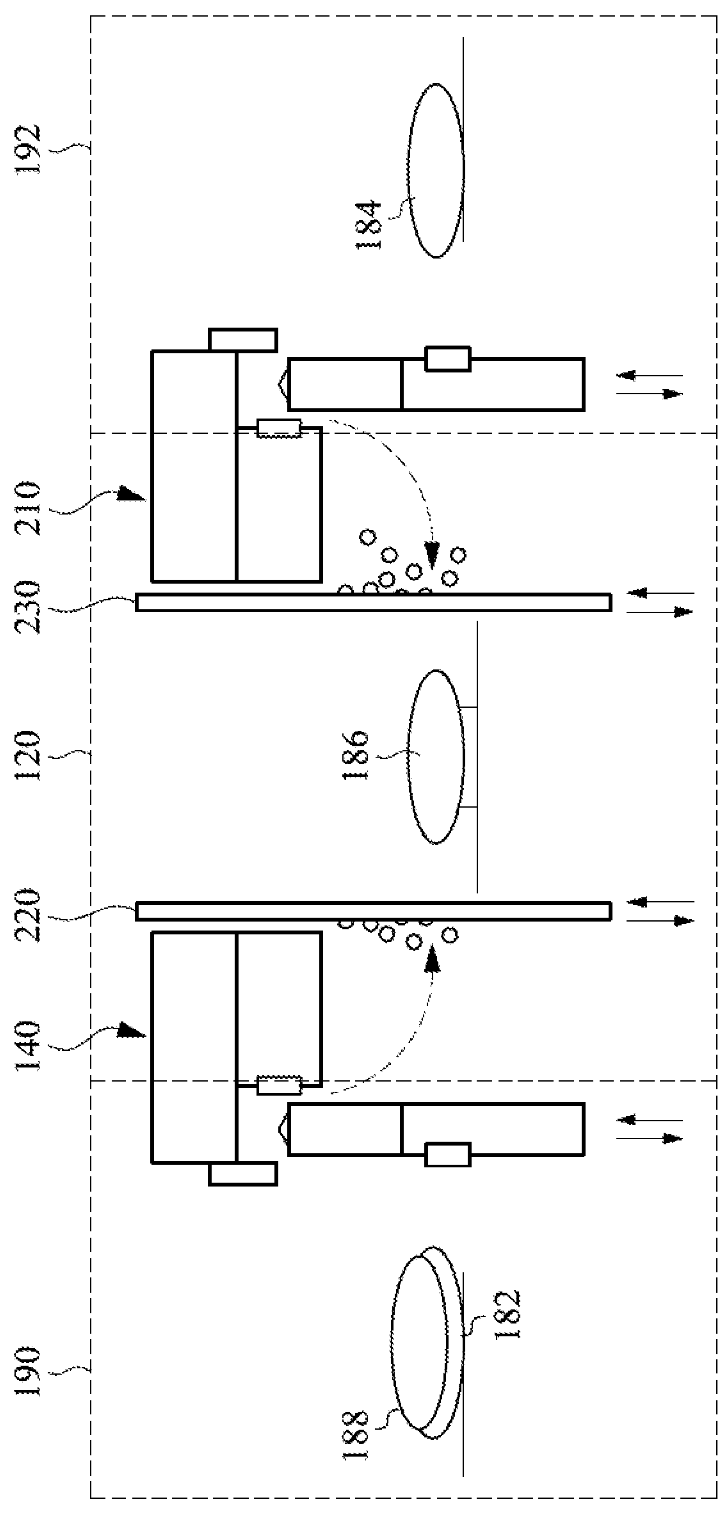
FIG. 9 is a side view schematic of a fourth embodiment of a load-lock apparatus. Two actuated shields are present within the load-lock chamber.

FIG. 9 is a side view schematic of a fourth embodiment of a load-lock apparatus. In this embodiment, two shields 220, 230 are located within the load-lock chamber 120, rather than outside the load-lock chamber as in FIG. 5. Here, the first or upstream shield 220 is present in the load-lock chamber adjacent the primary gate valve 140. The upstream shield can also be described as being located upstream of the load-lock wafer position 186. A second or downstream shield 230 is present in the load-lock chamber adjacent the secondary gate valve 210. The downstream shield can also be described as being located downstream of the load-lock wafer position 186. These two shields will reduce or prevent particles from landing at the load-lock wafer position 186. Both shields 220, 230 are illustrated in the form of a rectangular wall.

It is contemplated that the two shields 220, 230 could be considered as one shield located within the load-lock chamber, similar to that of FIG. 7, but with the shield being in the form of two walls 220, 230. One wall is located upstream of the load-lock wafer position 186 adjacent the primary gate valve 140. The other wall is located downstream of the load-lock wafer position 186 adjacent the secondary gate valve 210.

Figure 10:
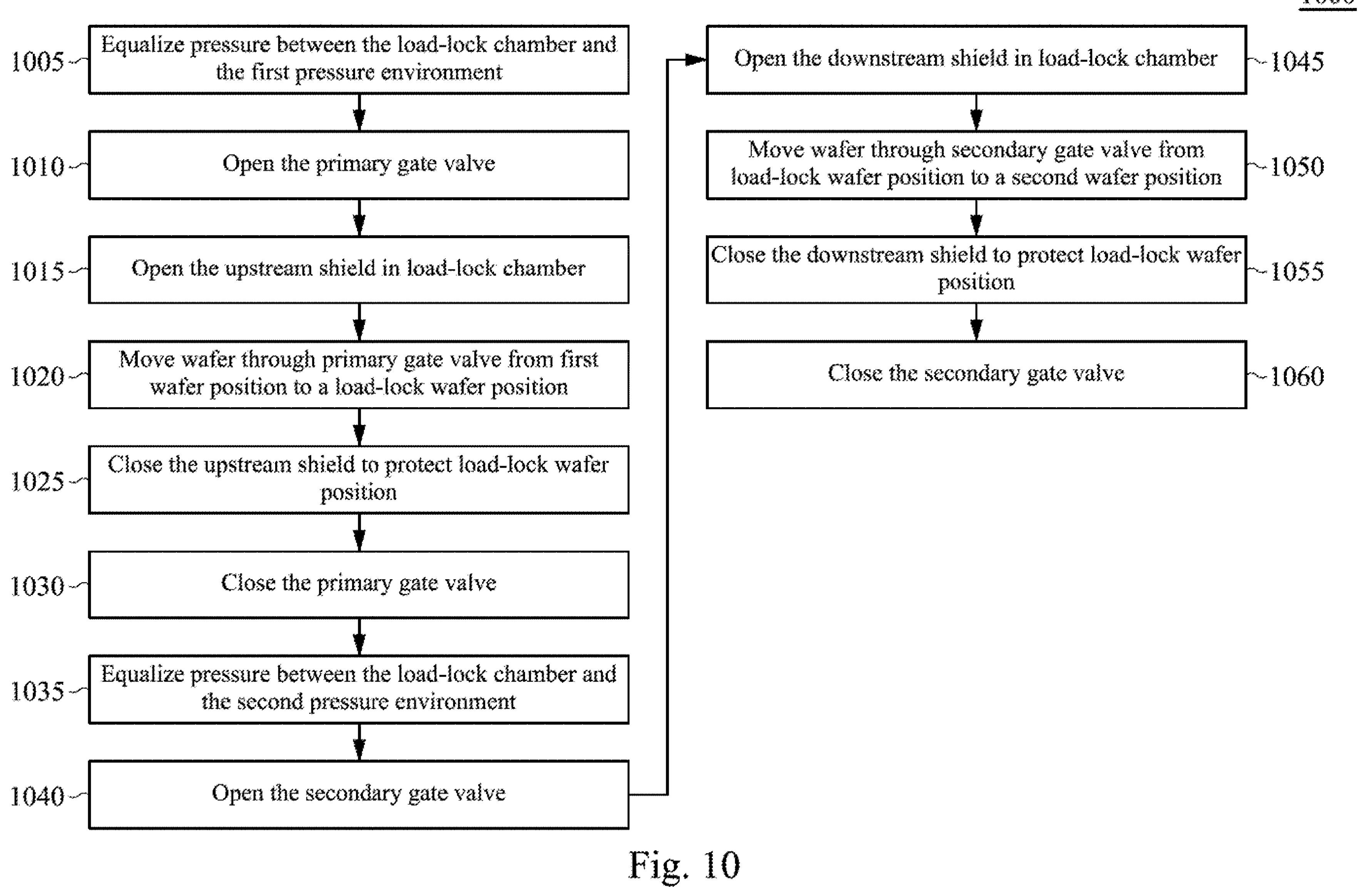
FIG. 10 is a flow chart illustrating another method for transferring a wafer between a first pressure environment and a second pressure environment through a load-lock chamber.

FIG. 10 is a flow chart illustrating another method 1000 for transferring a wafer between a first pressure environment and a second pressure environment through a load-lock chamber. The various steps of the method are described with reference to FIG. 9.

Initially, it is assumed that the primary gate valve 140, the upstream shield 220, the secondary gate valve 210, and the downstream shield 230 are all in the closed position. In step 1005, the load-lock chamber pressure can be equalized with the first pressure environment.

Next, in step 1010, the primary gate valve 140 is opened. In step 1015, the upstream shield 220 is opened. Steps 1010 and 1015 can be performed in any order. Next, in step 1020, the wafer substrate 188 is transferred from the first wafer position 182 through the primary gate valve 140 to the load-lock wafer position 186 in the load-lock chamber. Next, in step 1025, the upstream shield 220 is closed to protect the load-lock wafer position. Then, in step 1030, the primary gate valve 140 is closed. As a result, the load-lock chamber is gas-tight.

Continuing, in step 1035 the load-lock chamber pressure is equalized with the second pressure environment 192. Then, in step 1040, the secondary gate valve 210 is opened. In step 1045, the downstream shield 230 is opened. Again, steps 1040 and 1045 can be performed in any order. Next, in step 1050, the wafer substrate 188 is transferred from the load-lock wafer position 186 in the load-lock chamber through the secondary gate valve to the second wafer position 184. Next, in step 1055, the downstream shield 230 is closed to protect the load-lock wafer position. Then, in step 1060, the secondary gate valve 210 is closed.

Figure 11:
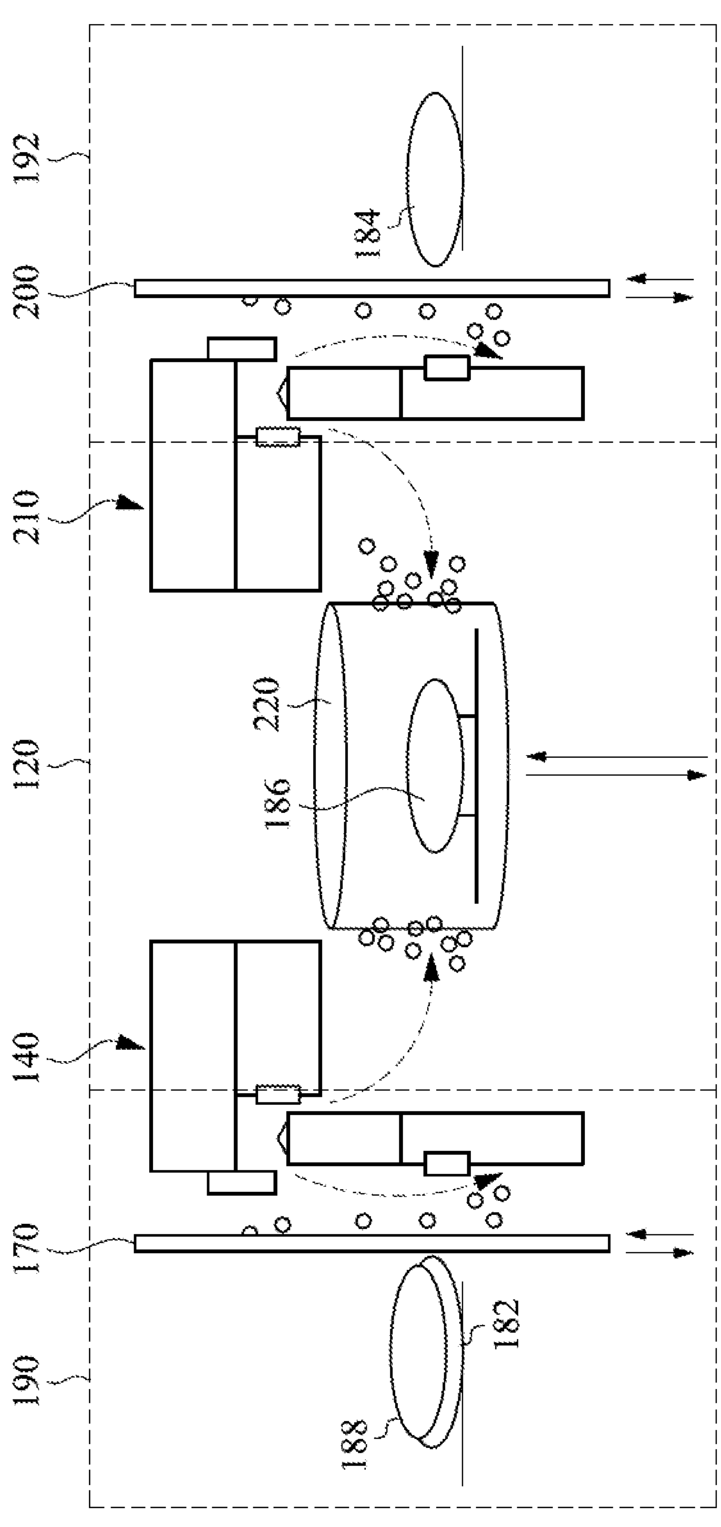
FIG. 11 is a side view schematic of a fifth embodiment of a load-lock apparatus. Three actuated shields are used.

FIG. 11 is a side view schematic of a fifth embodiment of a load-lock apparatus. In this embodiments, three shields 170, 200, 220 are present. Two shields 170, 200 are present outside of the load-lock chamber 120. A first or upstream shield 170 is present in the first pressure environment 190 adjacent the first or primary or upstream gate valve 140. A second or downstream shield 200 is present in the second pressure environment 192 adjacent the second or secondary or downstream gate valve 210. Both shields 170, 200 are illustrated as a rectangular wall. The third shield 220 is located within the load-lock chamber 120. This shield is shown in the form of a circular wall which surrounds the load-lock wafer position 186. In this embodiment, the first wafer position 182, the load-lock wafer position 186, and the second wafer position 184 are each protected from particles generated due to wear from either the primary gate valve 140 or the secondary gate valve 210.

FIG. 12 is a flow chart illustrating another method 1200 for transferring a wafer between a first pressure environment and a second pressure environment through a load-lock chamber. The various steps of the method are described with reference to FIG. 11.

Initially, it is assumed that the primary gate valve 140, the first shield 170, the shield 220 within the load-lock chamber, the secondary gate valve 210, and the second shield 200 are all in the closed position. In step 1205, the load-lock chamber pressure can be equalized with the first pressure environment.

Next, in step 1210, the primary gate valve 140 is opened. In step 1215, the first shield 170 is opened. In step 1220, the shield 220 in the load-lock chamber is opened. Steps 1210, 1215, 1220 can be performed in any order. Next, in step 1225, the wafer substrate 188 is transferred from the first wafer position 182 through the primary gate valve to the load-lock wafer position 186 in the load-lock chamber. Next, in step 1230, the first shield 170 is closed. In step 1235, the shield 220 in the load-lock chamber is closed. Steps 1230 and 1235 can be performed in any order. Then, in step 1240, the primary gate valve 140 is closed. As a result, the load-lock chamber is gas-tight.

Continuing, in step 1245 the load-lock chamber pressure is equalized with the second pressure environment 192. Then, in step 1250, the secondary gate valve 210 is opened. In step 1255, the shield 220 in the load-lock chamber is opened. In step 1260, the second shield 200 is opened. Again, steps 1250, 1255, and 1260 can be performed in any order. Next, in step 1265, the wafer substrate 188 is transferred from the load-lock wafer position 186 in the load-lock chamber through the secondary gate valve to the second wafer position 184. In step 1270, the shield 220 in the load-lock chamber is closed. In step 1275, the second shield 200 is closed. Steps 1270 and 1275 can be performed in any order. Then, in step 1280, the secondary gate valve 210 is closed.

Figure 13:
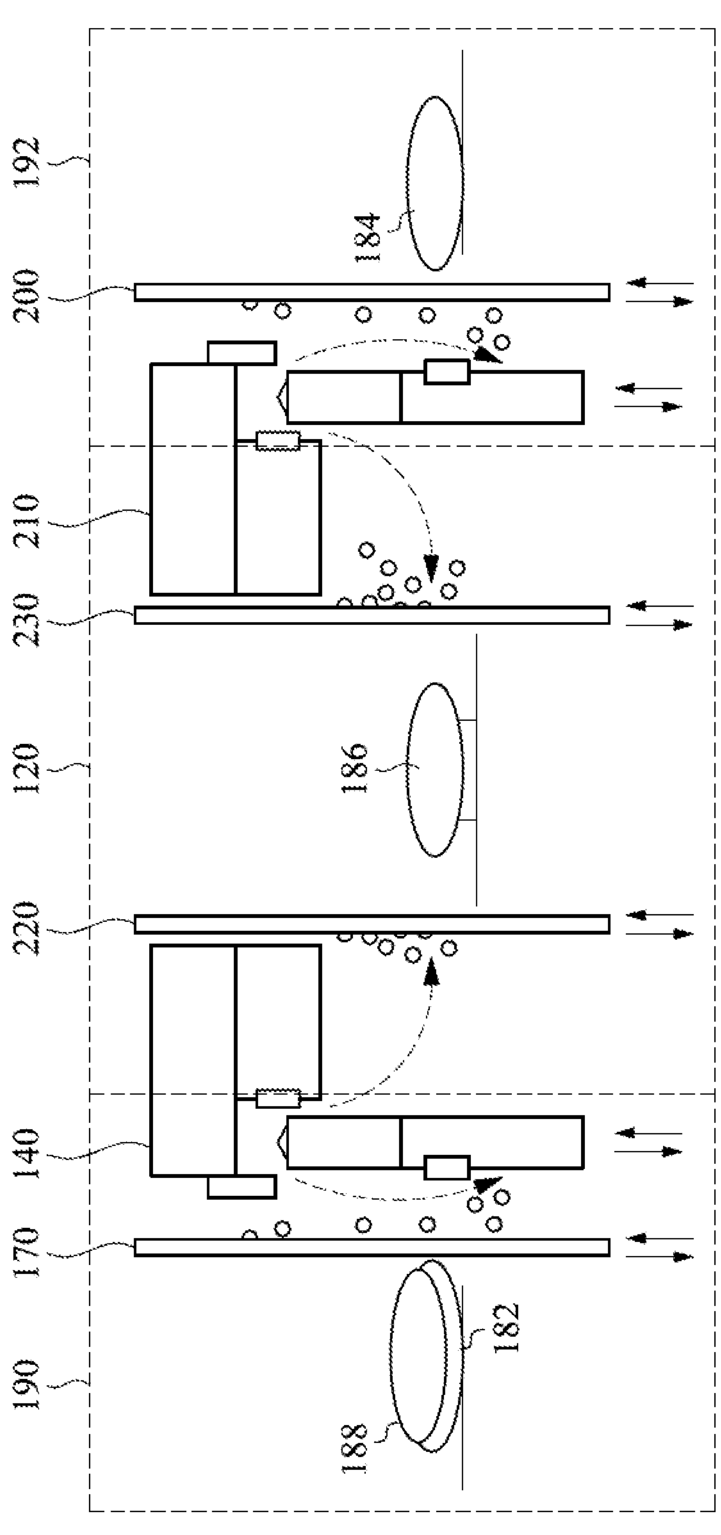
FIG. 13 is a side view schematic of a sixth embodiment of a load-lock apparatus. Four automatic shields are used, two inside the load-lock chamber and two outside the load-lock chamber.

FIG. 13 is a side view schematic of a sixth embodiment of a load-lock apparatus. In this embodiment, four shields 170, 200, 220, 230 are present.

Two shields 170, 200 are present outside of the load-lock chamber 120. A first shield 170 is present in the first pressure environment 190 adjacent the first or primary or upstream gate valve 140. A second shield 200 is present in the second pressure environment 192 adjacent the second or secondary or downstream gate valve 210. Both shields 170, 200 are illustrated as a rectangular wall.

In addition, two shields 220, 230 are located within the load-lock chamber 120. A third or upstream shield 220 is present in the load-lock chamber adjacent the primary gate valve 140. A fourth or downstream shield 230 is present in the load-lock chamber 120 adjacent the secondary gate valve 210. Both shields 220, 230 are illustrated in the form of a rectangular wall. Thus, in this embodiment, the first wafer position 182, the load-lock wafer position 186, and the second wafer position 184 are each protected from particles Again, it is contemplated that the third shield 220 and the fourth shield 230 could be considered as one shield located within the load-lock chamber, but in the form of two walls. One wall is located upstream of the load-lock wafer position 186 adjacent the primary gate valve 140. The other wall is located downstream of the load-lock wafer position 186 adjacent the secondary gate valve 210.

Figure 14:
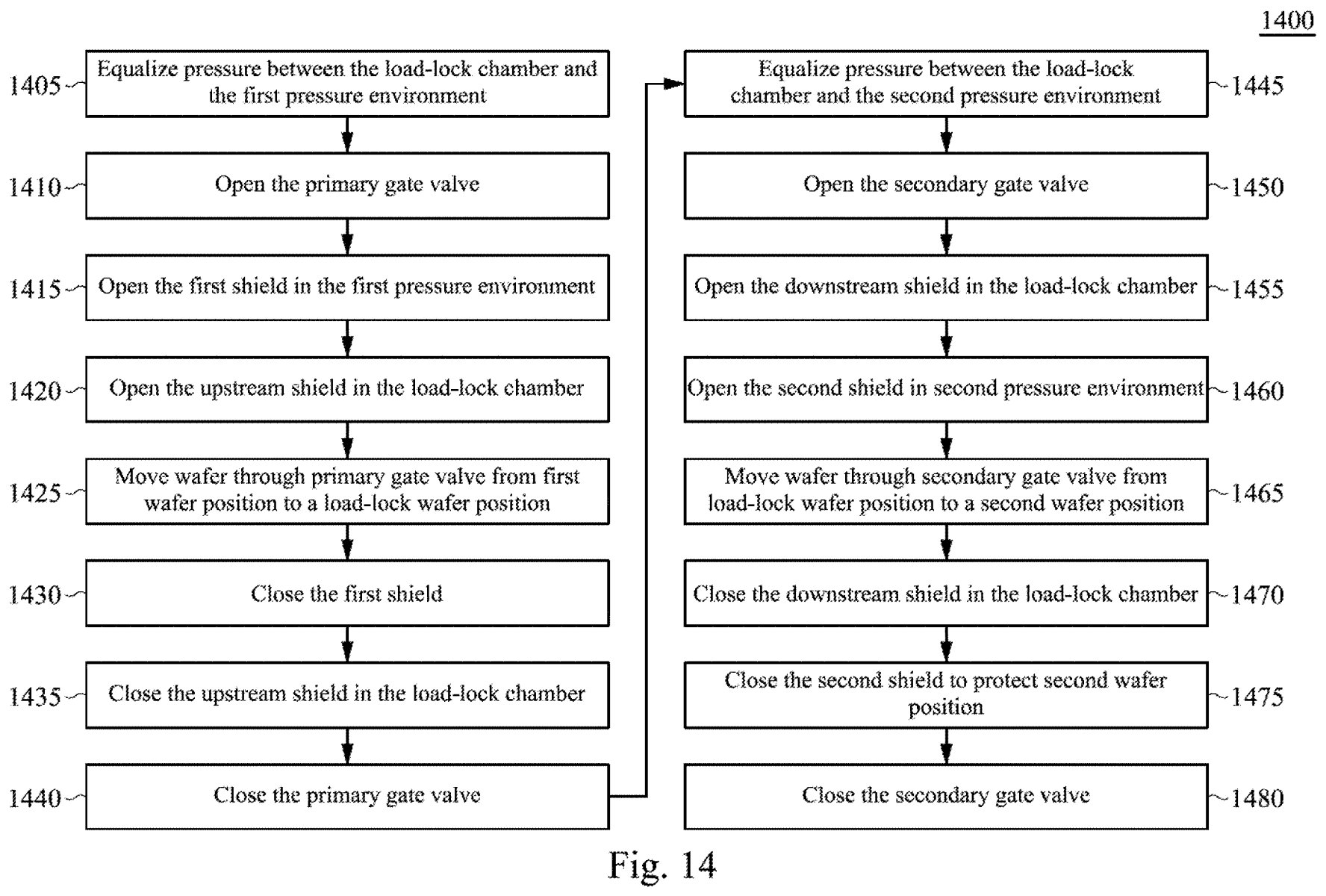

FIG. 14 is a flow chart illustrating another method 1400 for transferring a wafer between a first pressure environment and a second pressure environment through a load-lock chamber. The various steps of the method are described with reference to FIG. 13.

Initially, it is assumed that the primary gate valve 140, the first shield 170, the upstream shield 220 and the downstream shield 230 within the load-lock chamber, the secondary gate valve 210, and the second shield 200 are all in the closed position. In step 1405, the load-lock chamber pressure can be equalized with the first pressure environment.

Next, in step 1410, the primary gate valve 140 is opened. In step 1415, the first shield 170 is opened. In step 1420, the upstream shield 220 in the load-lock chamber is opened. Steps 1410, 1415, and 1420 can be performed in any order. Next, in step 1425, the wafer substrate 188 is moved from the first wafer position 182 through the primary gate valve to the load-lock wafer position 186 in the load-lock chamber. Next, in step 1430, the first shield 170 is closed. In step 1435, the upstream shield 220 in the load-lock chamber is closed. Steps 1430 and 1435 can be performed in any order. Then, in step 1440, the primary gate valve 140 is closed. The load-lock chamber is thus gas-tight.

Continuing, in step 1445 the load-lock chamber pressure is equalized with the second pressure environment 192. Then, in step 1450, the secondary gate valve 210 is opened. In step 1455, the downstream shield 230 in the load-lock chamber is opened. Next, in step 1460, the second shield 200 is opened. Again, steps 1450, 1455, and 1460 can be performed in any order. Next, in step 1465, the wafer substrate 188 is moved from the load-lock wafer position 186 in the load-lock chamber through the secondary gate valve to the second wafer position 184. In step 1470, the downstream shield 230 in the load-lock chamber is closed. In step 1475, the second shield 200 is closed. Steps 1470 and

1475 can be performed in any order. Then, in step 1480, the secondary gate valve 210 is closed.

The shield can be made from any appropriate material. More desirably, the shield is made from a corrosion-resistant material. Typically, the shield is also rigid. Suitable materials may include various plastics or metals. The opening/closing motion of the shield may be relatively fast, on the order of 1 second or less, to reduce the impact of adding the shield(s) into the transport path of the wafers.

A controller (not shown) can be used to control the various inputs and outputs, and to measure various conditions within the load-lock apparatus and the system with which the load-lock apparatus is used. The system may also include sensors (not shown) for monitoring applicable parameters. For example, such sensors may include those for measuring the pressure within each load-lock chamber, tracking the status of the gate valves and the shield(s), the temperature of the wafer substrate, etc. The controller can also determine whether to activate or deactivate the vacuum pump, how to control any valves, potentially also control the motion of any automated material handling system that may be present, etc. It is noted that these various parameters can be changed by the controller operating a computer program which alters their setpoints as appropriate. The controller may also include a user interface for communicating with operators.

The controller may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

Figure 15:
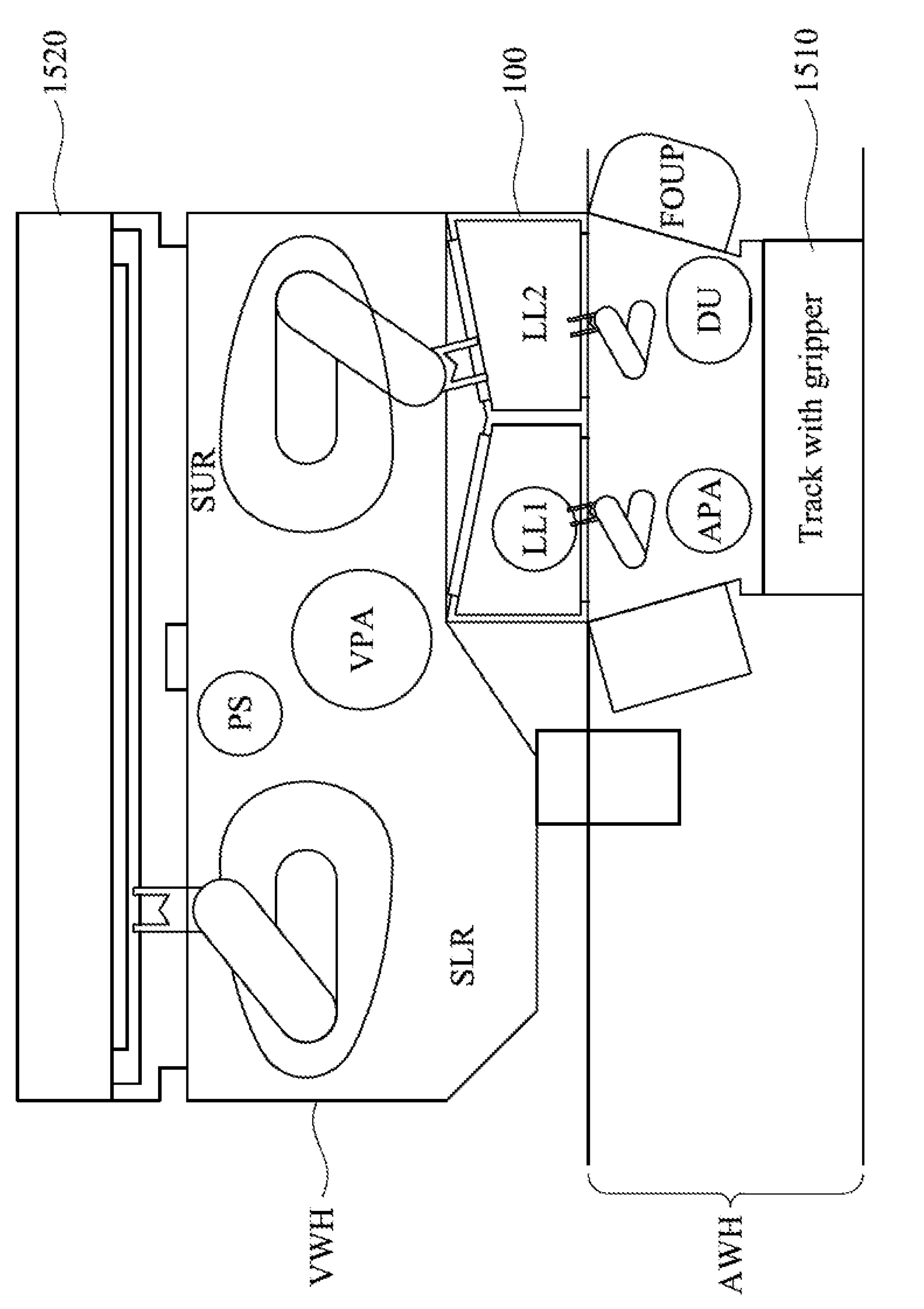
FIG. 15 is a plan view schematic diagram illustrating a system that includes an EUV tool, in which a load-lock apparatus having a load-lock chamber design as described above is used.

FIG. 15 is a plan view schematic diagram illustrating a system 1500 in which a load-lock apparatus having a load-lock chamber design as described above is used. The system includes an atmospheric wafer handling (AWH) module and a vacuum wafer handling (VWH) module which are linked to each other through a load-lock apparatus 100 as described above.

Initially, the load-lock apparatus 100 is illustrated as having two load-lock chambers LL1 and LL2. As illustrated here, LL1 is used to transfer wafer substrates from the AWH module to the VWH module. LL2 is used to transfer wafer substrates from the VWH module to the AWH module. This improves throughput. Each chamber includes one or more shields as described above.

Referring next to the AWH module, two different locations are illustrated from which a wafer substrate can be received. The first location 1510 includes a gripper which can receive a wafer substrate directly from another processing tool, such as a coating and development tool. The second location is a FOUP (Front Opening Unified Pod), which can be used to store semiconductor wafer substrates between process steps and for transportation between various processing machines/tools.

The AWH module includes an Atmospheric Load Robot (ALR) and an Atmospheric Unload Robot (AUR), which are located proximate LL1 and LL2, respectively. The AWH module also includes an Atmospheric Pre Align (APA) position and a Discharge Unit (DU) position. In this regard, a small notch is usually cut into the wafer substrate for alignment in a repeatable orientation during each processing step. The APA is used to identify the orientation of the wafer substrate, so the wafer substrate can be properly oriented prior to being picked up by the ALR and loaded into LL1. The AUR retrieves the wafer substrate from LL2 and moves it to the DU position or into the FOUP, as appropriate. The DU position is used as a storage position to permit orientation before a wafer substrate is picked up by the gripper and returned back to the first location 1510 and the processing tool located there.

The VWH module includes a Stage Load Robot (SLR), a Stage Unload Robot (SUR), a Park Station (PS) position, and a Vacuum Pre-Align (VPA) position. The SLR retrieves a wafer substrate from LL1 and moves the wafer substrate to the VPA position. At the VPA position, the wafer substrate can be deposited and its orientation verified again for proper pick-up by the SLR. The SLR can deposit the wafer substrate at the PS position to provide thermal control for the wafer substrate and the SLR prior to inserting the wafer substrate into the vacuum-pressure processing tool 1520. The vacuum-pressure processing tool may be, for example, an EUV photolithography system, with the VWH module being a part of the EUV photolithography tool. The SUR retrieves the wafer substrate from the vacuum-pressure processing tool 1520 and inserts it into LL2. It is noted that the VWH module may be part of the vacuum-pressure processing tool 1520, or may be a separate module.

To summarize, a wafer substrate may move from APA to ALR to LL1 and via SLR to VPA and PS into the vacuum-pressure processing tool 1520. The wafer substrate then moves from the vacuum-pressure processing tool 1520 via SUR to LL2 to AUR to either DU or FOUP. The APA, VPA, and DU positions may be rotatable for notch alignment/wafer orientation. The APA, DU, VPA, and vacuum-pressure processing tool may be considered the first wafer position or second wafer position of the methods described above, depending on the direction in which the wafer substrate is moving.

The introduction of additional protective shields to the load-lock chamber protects the wafer substrates from any particles which are generated at the gate valve. This reduces particle contamination and increases wafer yield. In addition, the amount of preventative maintenance can be reduced because the presence of the shields provides an additional measure that increases wafer quality. This reduces downtime and improves AVL.

Some embodiments of the present disclosure thus relate to methods for reducing particle contamination in a wafer transfer chamber. A wafer is moved from a first wafer position through an opening of a gate valve to a second wafer position. A downstream shield located between the gate valve and the second wafer position is moved from an open position to a closed position. The gate valve is then closed. The downstream shield protects the wafer from any particles generated by closing the gate valve.

Also disclosed are some methods for transferring a wafer between a first pressure environment and a second pressure environment through a load-lock chamber. A load-lock chamber pressure is equalized to the first pressure environment. An upstream gate valve leading from the first pressure environment to the load-lock chamber is opened. A first shield located in the first pressure environment upstream of the upstream gate valve is opened. The wafer is then transferred from a first wafer position in the first pressure environment through the upstream gate valve to a load-lock wafer position in the load-lock chamber. The first shield is closed, and the upstream gate valve is then closed. The load-lock chamber pressure is then equalized to the second pressure environment. A downstream gate valve leading from the load-lock chamber to the second pressure environment is opened. The wafer is transferred from the load-lock wafer position in the load-lock chamber through the downstream gate valve to a second wafer position in the second pressure environment. A second shield located in the second pressure environment downstream of the downstream gate valve is closed. The downstream gate valve is then closed.

Other methods for transferring a wafer between a first pressure environment and a second pressure environment through a load-lock chamber are also disclosed. A load-lock chamber pressure is equalized to the first pressure environment. A primary gate valve leading from the first pressure environment to the load-lock chamber is opened. A shield located in the load-lock chamber is opened. The wafer is then transferred from a first wafer position in the first pressure environment to a load-lock wafer position in the load-lock chamber. The shield located in the load-lock chamber is located, and then the primary gate valve is closed. The load-lock chamber pressure is then equalized to the second pressure environment. A secondary gate valve leading from the load-lock chamber to the second pressure environment is opened. The shield located in the load-lock chamber is opened. The wafer is then transferred from the load-lock wafer position in the load-lock chamber to a second wafer position in the second pressure environment. The shield located in the load-lock chamber is closed, and then the secondary gate valve is closed Still other methods for transferring a wafer between a first pressure environment and a second pressure environment through a load-lock chamber are disclosed herein. A load-lock chamber pressure is equalized to the first pressure environment. A primary gate valve leading from the first pressure environment to the load-lock chamber is opened. A first shield located in the first pressure environment upstream of the primary gate valve is also opened. The wafer is transferred from a first wafer position in the first pressure environment to a load-lock wafer position in the load-lock chamber. A shield located in the load-lock chamber is closed. The primary gate valve is then closed. The load-lock chamber pressure is then equalized to the second pressure environment. A secondary gate valve leading from the load-lock chamber to the second pressure environment is opened. The shield located in the load-lock chamber is opened. The wafer is then transferred from the load-lock wafer position in the load-lock chamber to a second wafer position in the second pressure environment. A second shield located in the second pressure environment between the secondary gate valve and the second wafer position is closed. The shield located in the load-lock chamber is also closed. The secondary gate valve is then closed.

Also disclosed herein are various embodiments of a load-lock apparatus. The apparatus includes a pressurizable load-lock chamber that includes a first gate valve, a second gate valve opposite the first gate valve, and an internal wafer position between the first gate valve and the second gate valve. One or more shields are also present. Each shield is movable between an open position and a closed position. The shield(s) are located outside the load-lock chamber adjacent the first gate valve, between the first gate valve and the internal wafer position, between the second gate valve and the internal wafer position, and/or outside the load-lock chamber adjacent the second gate valve. Depending on the embodiment, a total of one, two, three, or four shields may be present in these locations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for reducing particle contamination in a wafer transfer chamber, comprising:

moving a wafer from a first wafer position through an opening of a gate valve to a second wafer position;

moving a downstream shield located between the gate valve and the second wafer position from an open position to a closed position; and closing the gate valve after the downstream shield is moved to the closed position;

wherein the downstream shield protects the wafer from any particles generated by closing the gate valve.

2. The method of claim 1, wherein the downstream shield has a height at least equal to a vertical distance between a gate valve seat and the second wafer position.

3. The method of claim 1, wherein the downstream shield is in the form of a rectangular wall between the second wafer position and the gate valve.

4. The method of claim 3, wherein the rectangular wall has a width that is greater than a width of the gate valve.

5. The method of claim 1, wherein the downstream shield is in the form of a circular wall that also surrounds the wafer at the second wafer position.

6. The method of claim 1, further comprising, prior to passing the wafer from the first wafer position through the opening of the gate valve to the second wafer position:

opening the gate valve; and moving an upstream shield located between the first wafer position and the gate valve from a closed position to an open position.

7. The method of claim 6, further comprising:

prior to opening the gate valve, moving the downstream shield from the open position to the closed position; and after opening the gate valve, moving the downstream shield from the closed position to the open position.

8. The method of claim 1, further comprising changing a pressure at the second wafer location to match a pressure at the first wafer location.

9. The method of claim 1, wherein a downwards airflow is also provided between the first wafer position and the gate valve.

10. A method for transferring a wafer between a first pressure environment and a second pressure environment through a load-lock chamber, comprising:

equalizing a load-lock chamber pressure to the first pressure environment;

opening an upstream gate valve leading from the first pressure environment to the load-lock chamber;

transferring the wafer from a first wafer position in the first pressure environment through the upstream gate valve to a load-lock wafer position in the load-lock chamber;

closing a first shield located in the first pressure environment upstream of the upstream gate valve;

closing the upstream gate valve;

equalizing the load-lock chamber pressure to the second pressure environment;

opening a downstream gate valve leading from the load-lock chamber to the second pressure environment;

transferring the wafer from the load-lock wafer position in the load-lock chamber through the downstream gate valve to a second wafer position in the second pressure environment;

closing a second shield located in the second pressure environment downstream of the downstream gate valve; and closing the downstream gate valve.

11. The method of claim 10, wherein:

the first shield has a height at least equal to a vertical distance between an upstream gate valve seat and the first wafer position; or the second shield has a height at least equal to a vertical distance between a downstream gate valve seat and the second wafer position.

12. The method of claim 10, wherein the load-lock chamber is attached to an EUV photolithography tool.

13. The method of claim 10, further comprising closing a shield located within the load-lock chamber prior to closing the upstream gate valve or closing the downstream gate valve.

14. The method of claim 13, wherein the shield located within the load-lock chamber is in the form of a circular wall that also surrounds the wafer at the load-lock wafer position.

15. The method of claim 10, further comprising closing a third shield located within the load-lock chamber and downstream of the upstream gate valve prior to closing the upstream gate valve.

16. The method of claim 15, further comprising closing a fourth shield located within the load-lock chamber and upstream of the downstream gate valve prior to closing the downstream gate valve.

17. A method for transferring a wafer between a first pressure environment and a second pressure environment through a load-lock chamber, comprising:

equalizing a load-lock chamber pressure to the first pressure environment;

opening a primary gate valve leading from the first pressure environment to the load-lock chamber;

opening a shield located in the load-lock chamber after opening the primary gate valve;

transferring the wafer from a first wafer position in the first pressure environment through the primary gate valve to a load-lock wafer position in the load-lock chamber;

closing the shield located in the load-lock chamber after transferring the wafer to the load-lock wafer position;

closing the primary gate valve after the shield located in the load-lock chamber is closed;

equalizing the load-lock chamber pressure to the second pressure environment;

opening a secondary gate valve leading from the load-lock chamber to the second pressure environment;

opening the shield located in the load-lock chamber after opening the secondary gate valve; and transferring the wafer from the load-lock wafer position in the load-lock chamber to a second wafer position in the second pressure environment;

closing the shield located in the load-lock chamber; and closing the secondary gate valve after closing the shield located in the load-lock chamber.

18. The method of claim 17, wherein the shield located within the load-lock chamber is in the form of a circular wall that also surrounds the wafer at the load-lock wafer position.

19. The method of claim 17, wherein the shield located within the load-lock chamber is made up of two walls, one wall located upstream of the load-lock wafer position adjacent the primary gate valve, and the other wall located downstream of the load-lock wafer position adjacent the secondary gate valve.

20. The method of claim 17, where the shield located within the load-lock chamber has a height at least equal to a vertical distance between a gate valve seat and the load-lock wafer position.

* * * * *